(12) United States Patent
Kuriyama

(10) Patent No.: US 6,492,869 B1
(45) Date of Patent: Dec. 10, 2002

(54) LINEAR AMPLIFIER AND RADIO COMMUNICATION APPARATUS USING THE SAME

(75) Inventor: Yasuhiko Kuriyama, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/671,018

(22) Filed: Sep. 28, 2000

(30) Foreign Application Priority Data

Sep. 30, 1999 (JP) ............................ 11-280010

(51) Int. Cl.[7] .............................. H03G 5/16; H03F 3/04
(52) U.S. Cl. ...................... 330/133; 330/134; 330/288; 330/296; 330/310
(58) Field of Search ............................. 330/133, 134, 330/288, 296, 310

(56) References Cited

U.S. PATENT DOCUMENTS

| 4,064,463 A | * | 12/1977 | Leidich | ...................... 330/288 |
| 4,467,289 A | * | 8/1984 | Okada | ......................... 330/288 |
| 4,804,927 A | * | 2/1989 | Yamakoshi et al. | .......... 330/288 |
| 5,608,353 A | | 3/1997 | Pratt | ............................ 330/296 |
| 5,844,443 A | * | 12/1998 | Wong | ........................... 330/301 |

OTHER PUBLICATIONS

H. Asano, et al., "A 900MHz HBT Power Amplifier MMICs with 55% Efficiency, at 3.3 V Operation", IEEE MTT-S International Microwave Symposium, Jun. 7, 1998, pp. 205–208.

* cited by examiner

*Primary Examiner*—Robert Pascal
*Assistant Examiner*—Khanh Van Nguyen
(74) *Attorney, Agent, or Firm*—Oblon, Spivak, McClelland, Maier & Neustadt, P.C.

(57) ABSTRACT

A linear amplifier comprises a first current-mirror circuit including a first transistor whose base and collector are short-circuited for diode connection and whose collector is connected via a first resistance to a power-supply terminal, a second current-mirror circuit including a second transistor whose collector and base are connected to power-supply terminals, and an amplification transistor whose emitter is grounded. The base of the first transistor and the emitter of the second transistor are connected to the base of the amplification transistor.

31 Claims, 10 Drawing Sheets

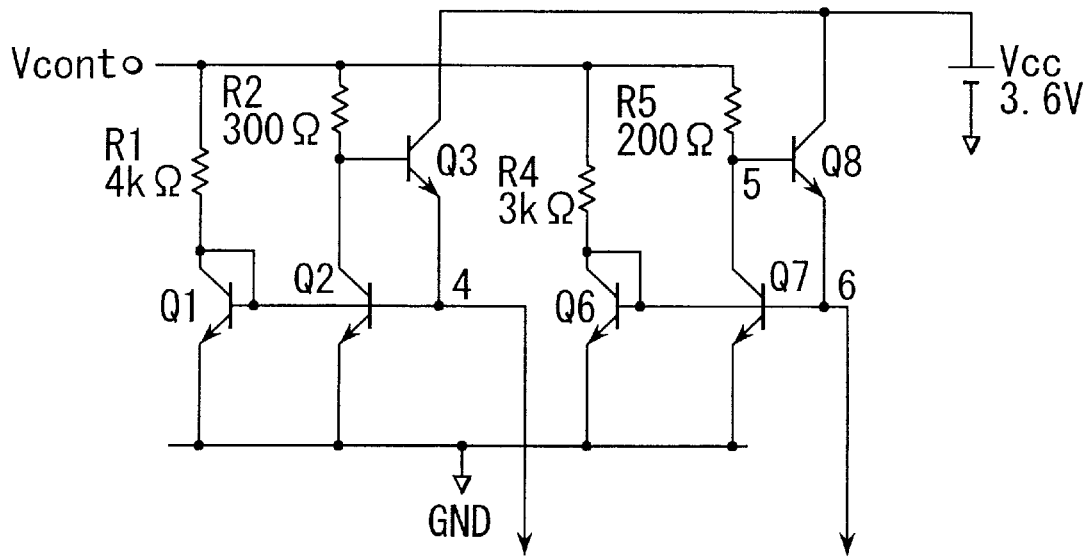
FIG. 12   TO BASE OF RF1   TO BASE OF RF2
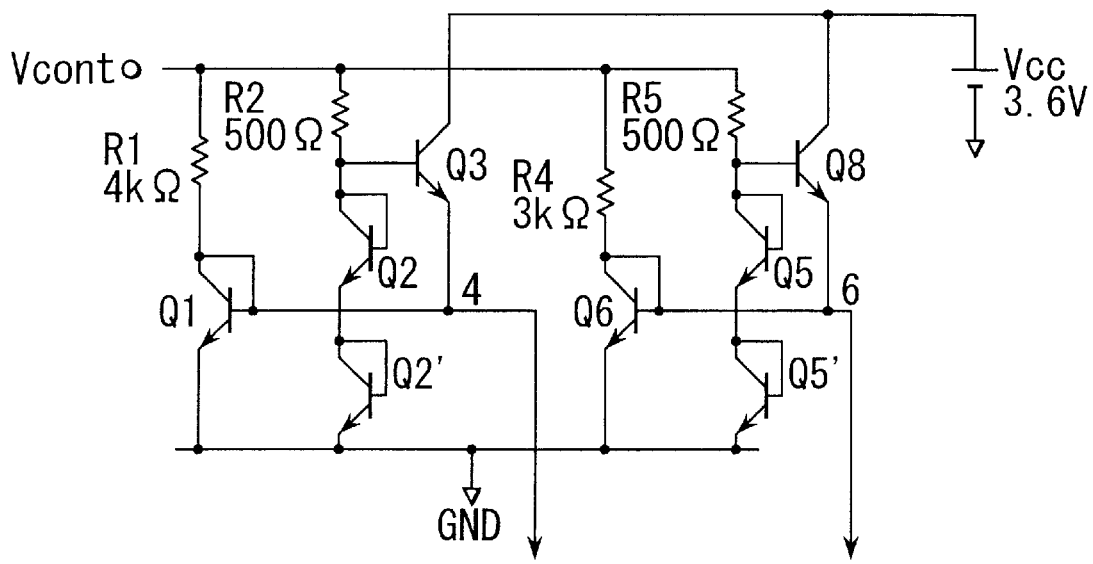
FIG. 13   TO BASE OF RF1   TO BASE OF RF2

LINEAR AMPLIFIER AND RADIO COMMUNICATION APPARATUS USING THE SAME

CROSS-REFERENCE TO RELATED APPLICATIONS

This application is based upon and claims the benefit of priority from the prior Japanese patent application No. 11-280010, filed Sep. 30, 1999, the entire contents of which are incorporated herein by reference.

BACKGROUND OF THE INVENTION

This invention relates to a linear amplifier and a radio communication apparatus using the linear amplifier, and more particularly to a linear amplifier with a gain varying function using bipolar transistors and a radio communication apparatus using this linear amplifier.

When a modulated wave signal whose amplitude varies greatly is dealt with, a conventional amplifier is used in the range of values far backed off from the saturated output to prevent gain compression from limiting the amplitude. Thus, it is impossible to use the amplifier in its high efficiency region.

As for a method of using such an amplifier as a linear amplifier up to almost the saturated output point, various linearizers (see FIG. 22) for canceling the nonlinear characteristics have been designed. Typical linearizers include a system for producing the reverse distortion component in the input signal beforehand and a system for varying the gain of an amplifier according to a variation in the amplitude of the input signal and equalizing the gain in the gain compression region to that in the linear region.

In such linearizers, their added circuits are complex and consume a lot of power. They can be used in the last-stage amplifier in a base station that amplifies high power. They, however, have not been put to practical use in the field of about 1-W-output amplifiers for use with portable telephones, because they have many disadvantages in that the total efficiently hardly improves and the size of the component parts is large.

On the other hand, a high-efficiency amplifier that presents a linear characteristic in a wide dynamic output range is realized by setting the bias condition to class B amplification to reduce the idle current. Actually, however, since the distortion becomes greater due to the nonlinear characteristic of the mutual conductance of elements, it is impossible to set the bias condition to heavy class B amplification by which the idle current is reduced extremely. Therefore, it is desirable that, in a low-output level region where the distortion is small, the bias should be varied in such a manner that the bias current is reduced extremely.

Since in a class-B amplifier using bipolar transistors, the average collector current increases according to the output level, the bias circuit has to supply a sufficient current equivalent to an increase in the average base current accordingly. For this reason, in a current-mirror circuit for supplying the base current via the emitter-follower and others, a bias circuit for supplying a voltage with a reduced impedance shown in FIG. 20 or 21 is generally used.

In the bias circuit shown in FIG. 20, the collector of a transistor Q21 is connected to one end of a resistance R21 via a terminal 11. A control voltage of Vcont is applied to the other end of the resistance R21 (on a terminal 2' side). The base of the transistor Q21 is connected to the emitter of a transistor Q3'. The base of the transistor Q3' is connected to the terminal 11. A power-supply voltage of vcc is applied to the collector of the transistor Q3'. The emitter of the transistor Q21 is grounded. The emitter of the transistor Q3' is not only rounded via a resistance R3' but also connected to the base of a terminal 4' amplification transistor.

In the bias circuit shown in FIG. 21, transistors Q4', Q5', are used in place of the transistor Q2'. Specifically, the emitter of the transistor Q4' is connected to the collector of the transistor Q5' and the collector of the transistor Q4' is connected to a resistance R21. The emitter of the transistor Q5' is grounded. The base and collector of the transistor Q4' are short-circuited. The base and collector of the transistor Q5' are short-circuited. These transistors function as diodes.

With such a circuit, when an attempt is made to reduce the current in proportion to the voltage, fluctuations in the bias current due to temperature changes cannot be compensated for sufficiently unless its control voltage Vcont is made very high. When the control voltage is made high, this becomes a serious problem in a system with a low control voltage, such as a portable telephone. Particularly in a system that has to operate linearly at an output level in a wide dynamic range, such as CDMA (Code Division Multiple Access), both the current and the gain are too large at a low output level at the bias point that satisfies the distortion characteristic at the high output level.

As explained above, when a conventional linear amplifier attempts to realize a linear operation in a high-efficiency operation, it requires a linearizer as shown in FIG. 22. The system using a linearizer, however, does not produce much effect in a 1-W-class amplifier, such as an amplifier for a portable telephone in terms of compactness and total efficiency. When such an amplifier is operated in the linear region, it is eventually used at 20 to 30% lower efficiency.

Furthermore, when an attempt is made to control the bias current in a wide range to reduce the current during the low output, it is necessary to raise the control voltage or sacrifice temperature compensation. This makes it difficult to lower the voltage or reduce the power consumption in a system that has to operate linearly at the output level in a wide dynamic rage, such as CDMA.

The object of the present invention is to provide a linear amplifier with a bias circuit which is capable of realizing a high-efficiency operation during high output, while maintaining a linear operation, and of reducing the bias voltage with a low control voltage during low output without increasing the number of circuits and the drawn current as compared with a conventional equivalent circuit, and a radio communication apparatus using the linear amplifier.

BRIEF SUMMARY OF THE INVENTION

According to a first aspect of the present invention, there is provided a linear amplifier comprising: a first current-mirror circuit including a first transistor whose base and collector are short-circuited for diode connection, whose collector is connected via a first resistance to a power-supply terminal, and whose emitter is grounded; a second current-mirror circuit including a second transistor whose collector and base are connected to power-supply terminals; and an amplification transistor whose emitter is grounded, wherein the base of the first transistor and the emitter of the second transistor are connected to the base of the amplification transistor.

According to a second aspect of the present invention, there is provided a linear amplifier including two or more stages of amplification transistors whose emitters are grounded, the linear amplifier comprising: a first current-mirror circuit including a first transistor whose base and collector are short-circuited for diode connection, whose collector is connected via a first resistance to a power-supply terminal, and whose emitter is grounded; and a second current-mirror circuit including a second transistor whose collector and base are connected to power-supply terminals, wherein the base of the first transistor and the emitter of the second transistor are connected to the base of a transistor at an earlier stage than the last stage of the amplification transistors.

In the linear amplifiers according to the first and second aspects of the present invention, it is desirable that they should meet the following configuration requirements:

(1) The collector of the first transistor and the base of the second transistor are connected to a common power supply.

(2) The base of the second transistor is connected via a second resistance to a power-supply terminal.

(3) The collector of the first transistor is connected via the first resistance to the base of the second transistor and the base of the second transistor is connected to the power-supply terminal of the first transistor.

(4) The first current-mirror circuit has a higher impedance than the second current-mirror circuit when viewed from the amplification transistor side.

(5) The base of the second transistor is grounded via a plurality of diodes connected in series.

(6) Each of the plurality of diodes is composed of a transistor whose base and collector are short-circuited for diode connection.

(7) The second current-mirror circuit includes a third transistor whose emitter is grounded, whose base is connected to the base of the first transistor, and whose collector is connected to the base of the second transistor.

(8) The first current-mirror circuit applies a bias to the base of the amplification transistor when the output level of the amplification transistor is low, and the second current-mirror circuit applies a bias to the base of the amplification transistor when the output level of the amplification transistor is high.

(9) The first and second current-mirror circuits are so set that the distortion of modulation in the amplification characteristic of the amplification transistor at an earlier stage than the amplification transistor at the last stage cancels the distortion of modulation in the amplification characteristic of the amplification transistor at the last stage.

According to a third aspect of the present invention, there is provided a linear amplifier comprising: a first current-mirror circuit including a first transistor whose base and collector are short-circuited for diode connection, whose collector is connected to a first resistance to a variable-power-supply terminal, and whose emitter is grounded, and a second current-mirror circuit including a second transistor whose collector is connected to a power-supply terminal and whose base is connected to a variable-power-supply terminal; and an amplification transistor whose emitter is grounded, wherein the base of the first transistor and the emitter of the second transistor are connected to the base of the amplification transistor.

According to a fourth aspect of the present invention, there is provided a linear amplifier including two or more stages of amplification transistors whose emitters are grounded, the linear amplifier comprising: a first current-mirror circuit including a first transistor whose base and collector are short-circuited for diode connection, whose collector is connected via a first resistance to a variable-power-supply terminal, and whose emitter is grounded; and a second current-mirror circuit including a second transistor whose collector is connected to a power-supply terminal and whose base is connected to a variable-power-supply terminal, wherein the first current-mirror circuit and the second current-mirror circuit are provided for each of the two or more stages of amplification transistors, and the base of the first transistor and the emitter of the second transistor are connected to the base of the corresponding one of the amplification transistors.

In the linear amplifiers according to the third and fourth aspects of the present invention, it is desirable that they should meet the following configuration requirements:

(1) The collector of the first transistor and the base of the second transistor are connected to a common power supply.

(2) All the variable-power-supply terminals in the first current-mirror circuit and the second current-mirror circuit provided for each stage of the two or more stages of amplification transistors are a common variable-power-supply terminal.

(3) The base of the second transistor is connected via a second resistance to a variable-power-supply terminal.

(4) The collector of the first transistor is connected via the first resistance to the base of the second transistor and the base of the transistor is connected to the variable-power-supply terminal of the first transistor.

(5) The first current-mirror circuit has a higher impedance than the second current-mirror circuit when viewed from the amplification transistor side.

(6) The base of the second transistor is grounded via a plurality of diodes connected in series.

(7) Each of the plurality of diodes is composed of a transistor whose base and collector are short-circuited for diode connection.

(8) The second current-mirror circuit includes a third transistor whose emitter is grounded, whose base is connected to the base of the first transistor, and whose collector is connected to the base of the second transistor.

(9) The power-supply terminal to which the collector of the second current-mirror circuit is connected is a fixed-potential power-supply terminal.

(10) The gain of the amplification transistors is varied by controlling the power-supply voltage at the variable-power-supply terminal.

According to a fifth aspect of the present invention, there is provided a linear amplifier including two or more stages of amplifiers composed of emitter-grounded transistors, the linear amplifier comprising: a bias circuit for supplying a direct-current bias base voltage to the amplification transistor at each stage of the amplifiers; a first current-mirror circuit which includes a first transistor whose base and collector are short-circuited for diode connection, determines the base voltage with the first transistor, and has a high output impedance; and a second current-mirror circuit which includes a second transistor whose base and collector are connected with each other via an emitter follower transistor, determines the base voltage with the second transistor, and has a low output impedance, and which is connected in parallel with the first current-mirror circuit.

According to a sixth aspect of the present invention, there is provided a linear amplifier comprising: a first current-mirror circuit including a diode element whose anode is connected via a first resistance to a power-supply terminal and whose cathode is grounded; a second current-mirror circuit including a transistor element whose collector and base are connected to power-supply terminals; and an amplification transistor whose emitter is grounded, wherein the anode of the diode element and the emitter of the transistor element are connected to the base of the amplification transistor.

According to a seventh aspect of the present invention, there is provided a linear amplifier including two or more stages of amplification transistors whose emitters are grounded, the linear amplifier comprising: a first current-mirror circuit including a diode element whose anode is connected via a first resistance to a power-supply terminal and whose cathode is grounded; and a second current-mirror circuit including a transistor element whose collector and base are connected to power-supply terminals, wherein the anode of the diode element and the emitter of the transistor element are connected to the base of an amplification transistor at an earlier stage than the last stage of the amplification transistors.

According to an eighth aspect of the present invention, there is provided a linear amplifier comprising: a first current-mirror circuit including a diode element whose anode is connected via a first resistance to a variable-power-supply terminal and whose cathode is grounded; a second current-mirror circuit including a transistor element whose collector is connected to a power-supply terminal and whose base is connected to a variable-power-supply terminal; and an amplification transistor whose emitter is grounded, wherein the anode of the diode element and the emitter of the transistor element are connected to the base of the amplification transistor.

According to a ninth aspect of the present invention, there is provided a linear amplifier including two or more stages of amplification transistors whose emitters are grounded, the linear amplifier comprising: a first current-mirror circuit including a diode element whose anode is connected via a first resistance to a variable-power-supply terminal and whose cathode is grounded; and a second current-mirror circuit including a transistor element whose collector is connected to a power-supply terminal and whose base is connected to a variable-power-supply terminal, wherein the first current-mirror circuit and the second current-mirror circuit are provided for each of the two or more stages of amplification transistors, and the anode of the diode element and the emitter of the transistor element are connected to the base of the corresponding one of the amplification transistors.

According to a tenth aspect of the present invention, there is provided a linear amplifier including two or more stages of amplifiers composed of emitter-grounded transistors, the linear amplifier comprising: a bias circuit for supplying a direct-current bias base voltage to the amplification transistor at each stage of the amplifiers; a first current-mirror circuit which includes a diode element, determines the base voltage with the diode element, and has a high output impedance; and a second current-mirror circuit which includes a second transistor whose base and collector are connected with each other via an emitter follower transistor, determines the base voltage with the second transistor, and has a low output impedance, and which is connected in parallel with the first current-mirror circuit.

Furthermore, there is provided a radio communication apparatus using any one of the linear amplifiers of the invention described above.

In the radio communication apparatus according to the present invention, it is desirable that the power-supply voltage at the variable-power supply terminal should be set low when the output level is low and thereby the gain of the amplification transistor at the last stage decrease. In a high output operation, the first current-mirror circuit applies a bias when the input level is low, and the second current-mirror circuit supplies a bias when the input level is high, in at least one amplification transistor other than one at the last stage and its bias circuit. This enables the AM—AM characteristic of the amplification transistor to cancel the AM—AM characteristic of the amplification transistor at the last stage. Therefore, even when the last stage is in a high-efficiency operation, the distortion of intermodulation can be decreased.

Furthermore, a linear operation at high efficiently and a smaller drawn current in low output can be realized by operating the first and second current-mirror circuits according to the control voltage that determines the input power level or bias current.

Moreover, in use at low power level, a smaller drawn current can be achieved without sacrificing distortion by lowering the control voltage to decrease the idle current. In addition, using the linear amplifier as the amplifier at the last stage of a CDMA terminal makes it possible to achieve a smaller drawn current in a wide output dynamic range and simplify the system.

For example, the terminal for the control voltage applied via a resistance functioning as the current source for the first current-mirror circuit of the amplifier is connected to the terminal for the control voltage applied via a resistance functioning as the current source for the second current-mirror circuit. With this connection, the first current-mirror circuit supplies the bias voltage when the control voltage is equal to or lower than twice the on voltage, the base-emitter voltage Vbe of the transistor, whereas the first and second current-mirror circuits supply the bias voltage when the control voltage is higher than the on voltage. This makes variations in the gain in the wide control voltage range compatible with compensation for its temperature changes. Furthermore, a smaller drawn current operation in low-gain, low-output use is possible by varying the control voltages in the bias circuits at the amplification stages including the last stage at the same time.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 12 is a circuit diagram of the bias circuit in a linear amplifier according to the third embodiment;

FIG. 13 is a circuit diagram of a modification of the bias circuit in a linear amplifier according to the third embodiment;

DETAILED DESCRIPTION OF THE INVENTION

Hereinafter, referring the accompanying drawings, embodiments of the present invention will be explained.

(First Embodiment)

Figure 1:
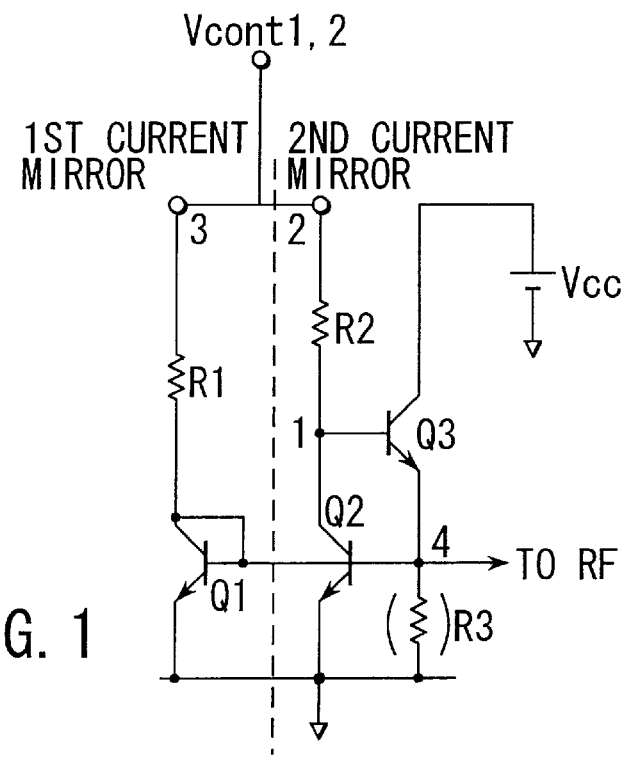
FIG. 1 is a circuit diagram of the bias circuit of a linear amplifier according to a first embodiment of the present invention.
Figure 2:
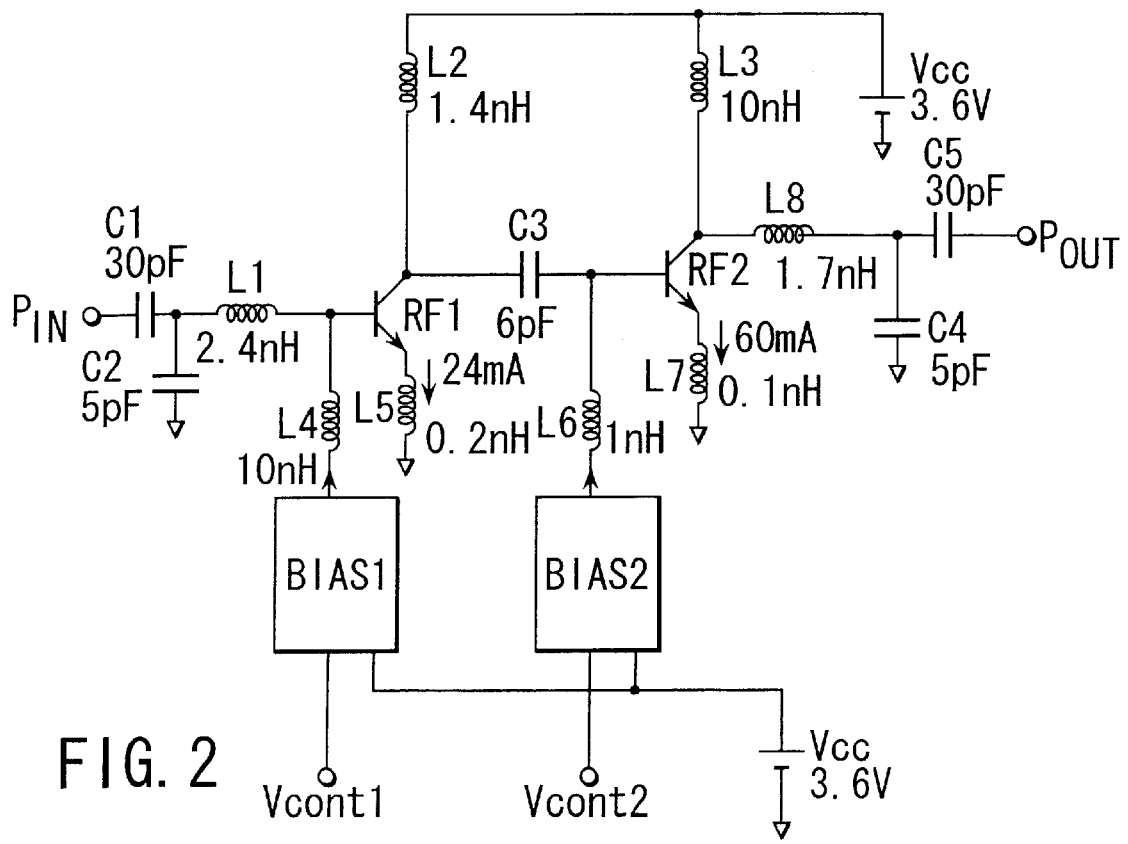
FIG. 2 is a circuit diagram of a linear amplifier according to the first embodiment and a second embodiment of the present invention.

FIG. 1 is a circuit diagram of the bias circuit of a linear amplifier according to a first embodiment of the present invention. FIG. 2 is a circuit diagram of a linear amplifier according to the first embodiment and a second embodiment of the present invention.

As shown in FIG. 2, the linear amplifier of the present invention is composed of a two-stage amplifier. An amplification bipolar transistor RF1 is the front-stage transistor and an amplification bipolar transistor RF2 is the back-stage transistor. A bias circuit BIAS1 and a bias circuit BIAS2 are connected to the base of the transistor RF1 and that of the transistor RF2, respectively. Capacitors C1 to C5 have capacitances 30 pF, 5 pF, 6 pF, 5 pF, and 30 pF, respectively as shown in the figure. In addition, inductors L1 to L8 have inductances 1.4 nH, 1.4 nH, 10 nH, 10 nH, 0.2 nH, 1 nH, 0.1 nH, and 1.7 nH, respectively. $P_{IN}$ indicates an input terminal and $P_{OUT}$ indicates an output terminal.

A power-supply voltage of Vcc=3.6V is applied via inductance L2 to the collector of the transistor RF1 and via inductance L3 to the collector of the transistor RF2. The bias circuits BIAS1 and BIAS2 are connected to control terminals, respectively. Control voltages Vcont1, Vcont2 are applied to the bias circuits BIAS1, BIAS2, respectively. The power-supply voltage of Vcc=3.6V is applied to each of the bias circuits BIAS1, BIAS2.

Next, the bias circuit of the first embodiment will be explained. As shown in FIG. 1, the collector of a transistor Q1 is connected to one end of a resistance R1. The control voltages Vcont1 and Vcont2 are applied to the other end of the resistance R1 (on the terminal 3 side). In addition, the collector of a transistor Q2 is connected to one end of a resistance R2 via a terminal 1. The control voltages Vcont1 and Vcont2 are applied to the other end of the resistance R2 (on the terminal 2 side). The terminals 3 and 2 of a first and a second current mirror are connected to each other and further to the control voltage (Vcont1, Vcont2) terminal.

The base and collector of the transistor Q1 are short-circuited. The transistor functions as a diode. The base of the transistor Q1 and that of a transistor Q2 are connected to each other and further connected to the emitter of a transistor Q3. The base of the transistor Q3 is connected to the terminal 1. The power-supply voltage Vcc is applied to the collector of the transistor Q3. Both of the emitters of the transistors Q1 and Q2 are grounded. The emitter side (terminal 4) of the transistor Q3 is also grounded. The emitter side may be grounded via a resistance R3. The terminal 4 is connected to the bases of the transistors RF1 and RF2.

In the bias circuit constructed as described above, the first current-mirror circuit is composed of the resistance R1 and transistor Q1, whereas the second current-mirror circuit is composed of the resistance R2 and transistors Q2 and Q3.

Figure 3:
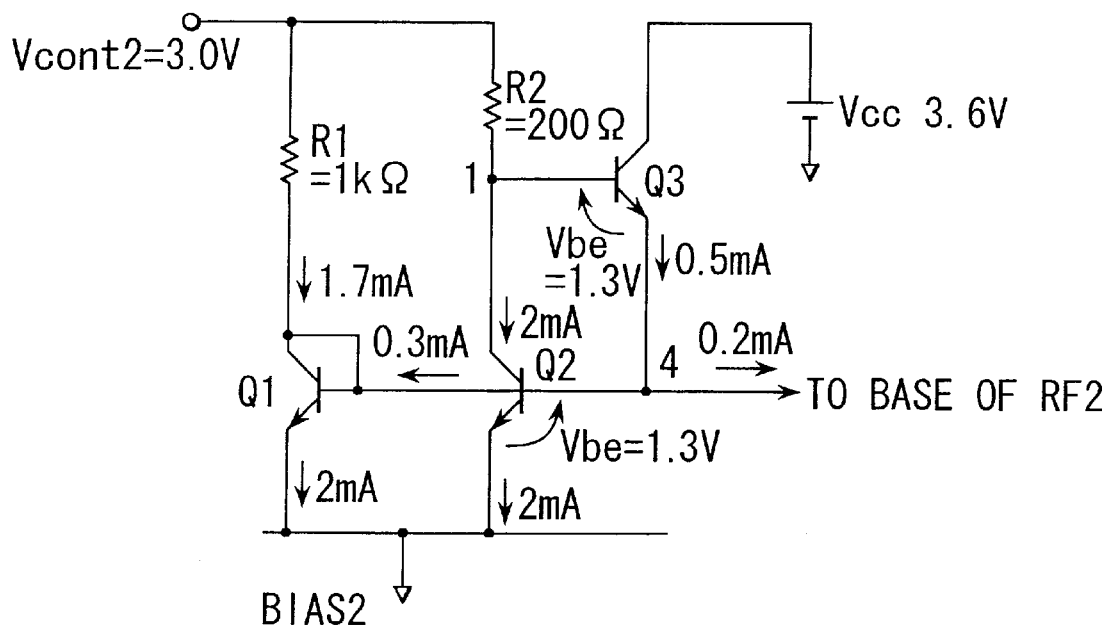
FIG. 3 is a circuit diagram showing the operating state of the bias circuit of FIG. 1 used in the back-stage amplifier in the linear amplifier of FIG. 2.
Figure 4:
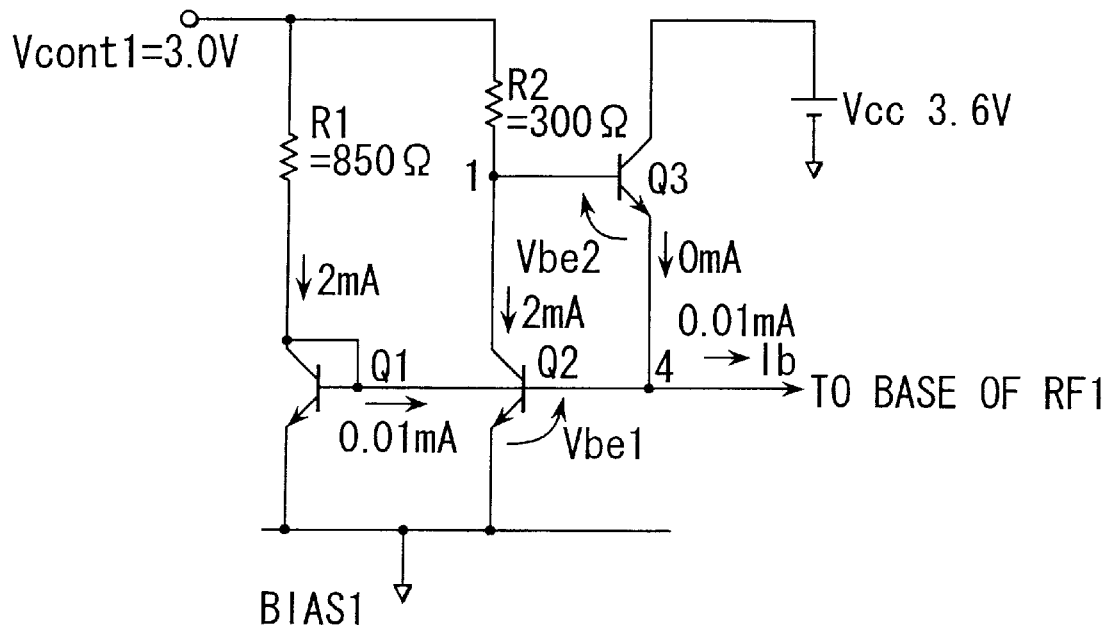
FIG. 4 is a circuit diagram showing the operating state of the bias circuit of FIG. 1 used in the front-stage amplifier in the linear amplifier of FIG. 2.

Next, explanation will be given about the setting and operation of the circuit in using the first and second current-mirror circuits in the bias circuit for the amplification bipolar transistors RF1 and RF2. FIGS. 3 and 4 are circuit diagrams showing the operating state of the bias circuit of FIG. 1 used in the back-stage amplifier and front-stage amplifier in the linear amplifier of FIG. 2, respectively.

In FIGS. 2 to 4, HBTs (Hetro-Bipolar Transistors) which use InGaP as their emitters and GaAs as their bases are used as the transistors. This type of transistor operates with the base-emitter voltage Vbe being at about 1.3V. The transistor Q1 has an emitter size of 4×20 um², the transistor Q2 has an emitter size of 4×20 um², and the transistor Q3 has an emitter size of 4×60 um². The amplification transistor RF1 has an emitter size of 4×30 um² and is of a multi-emitter structure with 6 emitters. The amplification transistor RF2 has an emitter size of 4×30 um² and is of a multi-emitter structure with 32 emitters.

As shown in FIG. 3, to realize high efficiency of the back-stage transistor RF2 during high output, the back-stage bias circuit (BIAS2) is designed to have the class AB bias setting. In this case, the resistances R1 and R2 and the control voltage Vcont2 are set so that the transistor Q3 of the second current-mirror circuit in the bias circuit of FIG. 1 may be already ON, or the voltage at terminal 1 may be equal to or lower than twice the base-emitter voltage Vbe.

For example, in the bias circuit BIAS2 of FIG. 3, if R1=1 KΩ, R2=200Ω, and the control voltage (Vcont2) is set to 3.0V, the voltage at terminal 1 will be about 2.6V, or twice as high as the base-emitter voltage Vbe and the collector current of the transistor will be about 2 mA and the collector current of the transistor Q1 will be also 2 mA (the transistors Q1 and Q2 have the same size). In addition, the current flowing through the resistance R1 will be 1.7 mA, the current flowing through the resistance R2 will be 2 mA, and the collector current of the transistor Q3 will be 0.5 mA. At this time, when the back-stage transistor RF2 has 30 times the size of the transistor Q1, the bias current of the transistor RF2 is set to about 60 MA.

Figure 5:
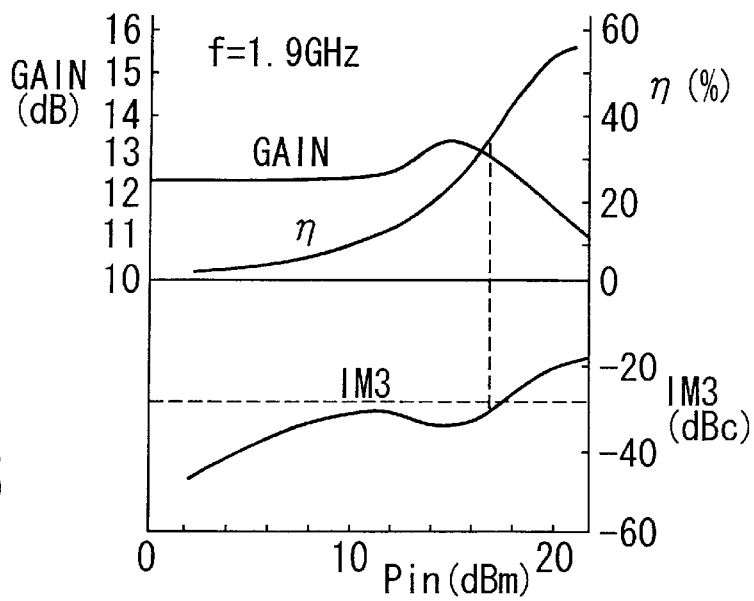
FIG. 5 is a characteristic diagram showing the AM—AM characteristic, efficiency, and distortion of only the back-stage amplifier in the linear amplifier of FIG. 2.

FIG. 5 is a characteristic diagram showing the AM—AM characteristic, efficiency, and distortion of only the back-stage amplifier in the linear amplifier of FIG. 2. As shown in FIG. 5, in the region where the efficiency (η) is high, IM3 with two frequency input has deteriorated significantly due to a shift in the AM—AM characteristic. Here, IM3 corresponds to distortion. To correct the AM—AM characteristic of the back-stage amplifier, the bias circuit (BIAS1) for the front-stage amplifier is so designed, when the RF input is zero or small, the bias voltage is determined only by the first current-mirror circuit and that, when the RF input level has risen, the bias voltage is determined by the second current-mirror circuit. This enables a change in the AM—AM characteristic of the front-stage amplifier to cancel a change in the AM—AM characteristic of the back-stage amplifier, improving the AM—AM characteristic of the entire two-stage amplifier.

For example, if R1=1850 W, R2=300 W, and the control voltage is set to 3.0V in the front-stage transistor RF1 as shown in FIG. 4, when the current flowing through the base of the transistor RF1 is 0.01 mA, the voltage at terminal is 2.4V, the collector currents of the transistors Q1 and Q2 are 2 mA, and the collector current of the transistor Q3 is about 0 mA. At this time, when the front-stage transistor RF1 has 12 times the size of the transistor Q1, the bias current of the transistor RF1 is biased to about 24 mA.

On the other hand, when the current flowing through the base of the transistor RF1 becomes 1.2 mA, if R1=850 W, R2=300 W and the control voltage is set to 3.0V, then the voltage at terminal 1 will be 2.46V, the collector currents of the transistors Q1 and Q2 will be 1.8 mA, and the collector current of the transistor Q3 will be about 0.9 mA. Both of the base currents of the transistors Q1 and Q2 will be 0.3 mA. Then, a current of 0.3+0.9=1.2 mA will flow to the base of the transistor RF1. At this time, when the front-stage transistor RF1 has 12 times the size of the transistor Q1, the bias current of the transistor RF1 is biased to about 21.6 mA.

When the base current IB of the transistor RF1 is zero or small, the transistor Q1 is on, but the transistor Q3 is OFF. As the base current IB starts to increase, the current flowing through the resistance R1 increases by an increase in the base current IB. This lowers the base-emitter voltage Vbe of the transistor Q1, lowering the gain produced by the first current-mirror circuit. Then, the transistor Q1 turns off.

Figure 6:
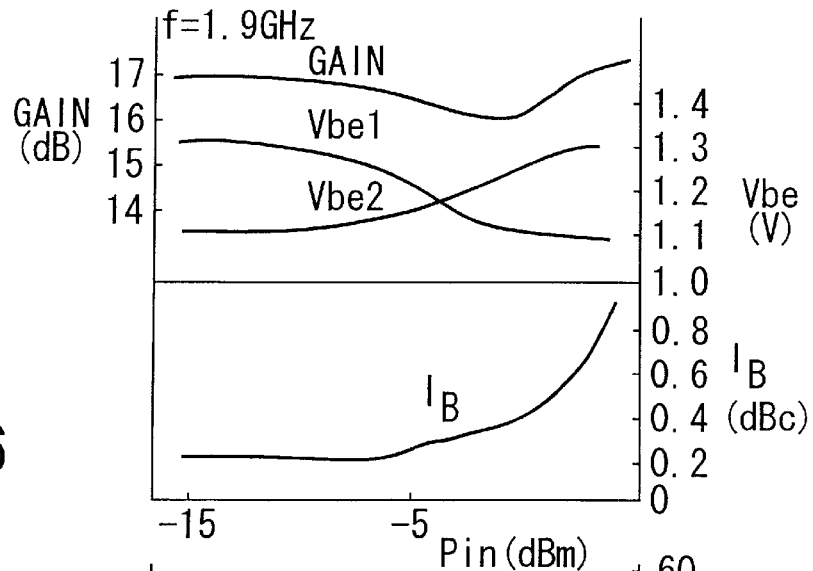
FIG. 6 is a characteristic diagram showing the AM—AM characteristic of only the front-stage amplifier in the linear amplifier of FIG. 2.

On the other hand, the emitter voltage of the transistor Q3 drops with the base voltage Vbe1 of the transistor Q1, allowing the base-emitter voltage Vbe2 of the transistor Q3 to turn on, which causes the second current-mirror circuit to operate. Thus, the transistor Q3 starts to supply the base current IB of the transistor RF1, which keeps the base voltage of the transistor RF1 constant, with the result that a rise in Gm caused by an increase in the collector current makes the gain increase. The AM—AM characteristic of only the front-stage amplifier in the linear amplifier of FIG. 2 is shown in FIG. 6.

Figure 7:
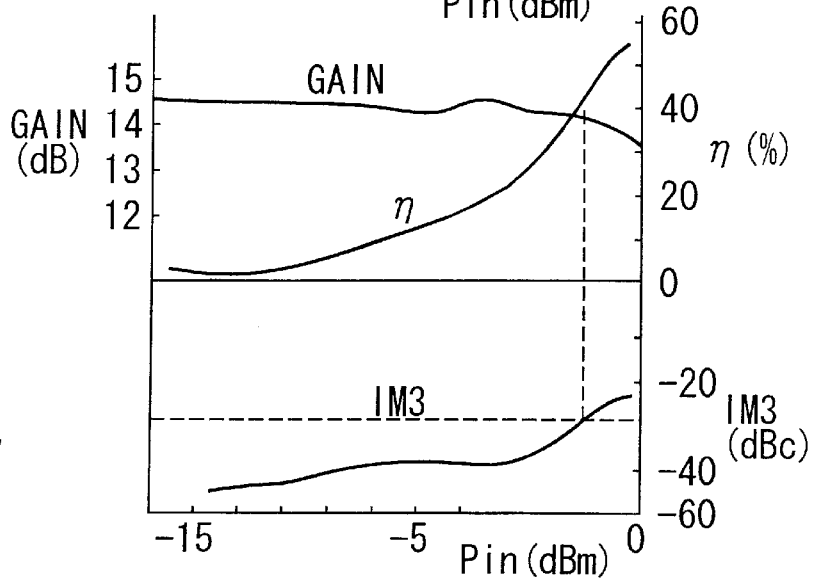
FIG. 7 is a characteristic diagram showing the AM—AM characteristic, efficiency, and distortion of the entire linear amplifier of FIG. 2.

FIG. 7 is a characteristic diagram showing the AM—AM characteristic, efficiency, and distortion of the entire linear amplifier of FIG. 2. Since the gain compression in the back-stage amplifier is compensated for by an increase in the gain in the front-stage amplifier, the amplifier can be operated linearly with almost no shift in the AM—AM characteristic, when being operated as a two-stage amplifier. Thus, it is seen that IM3 has been improved even at high efficiency.

(Second Embodiment)

Figure 8:
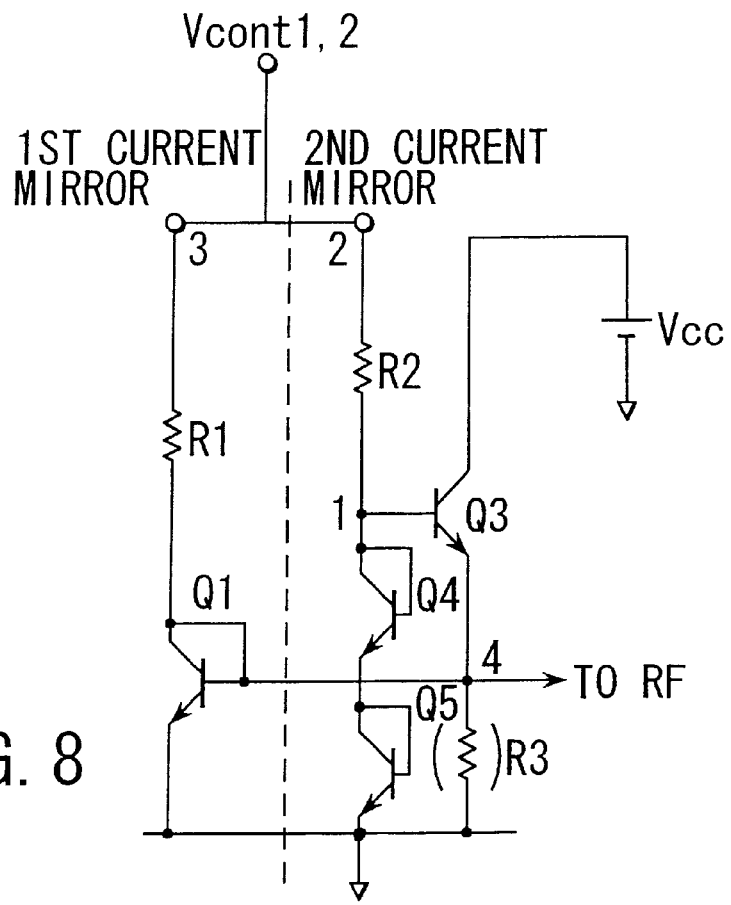
FIG. 8 is a circuit diagram of the bias circuit of a linear amplifier according to a second embodiment of the present invention.

FIG. 8 is a circuit diagram showing the configuration of the bias circuit of a linear amplifier according to a second embodiment of the present invention. The same parts as those in FIG. 1 are indicated by the same reference symbols. As shown in FIG. 8, the bias circuit in the linear amplifier of the second embodiment differs from that of the first embodiment in that a circuit composed of a series connection of base-collector-shorted transistors is used as the second current-mirror circuit.

Specifically, as shown in FIG. 8, in the second current-mirror circuit, the emitter of a transistor Q4 is connected to the collector of a transistor Q5, the collector of the transistor Q4 is connected to the resistance R2, and the emitter of a transistor Q5 is grounded. The base and collector of the transistor Q4 are connected to each other. The base and collector of the transistor Q5 are connected to each other. These transistors function as diodes. The base of the transistor Q1 is connected via terminal 4 to the bases of the transistors RF1, RF2.

Figure 9:
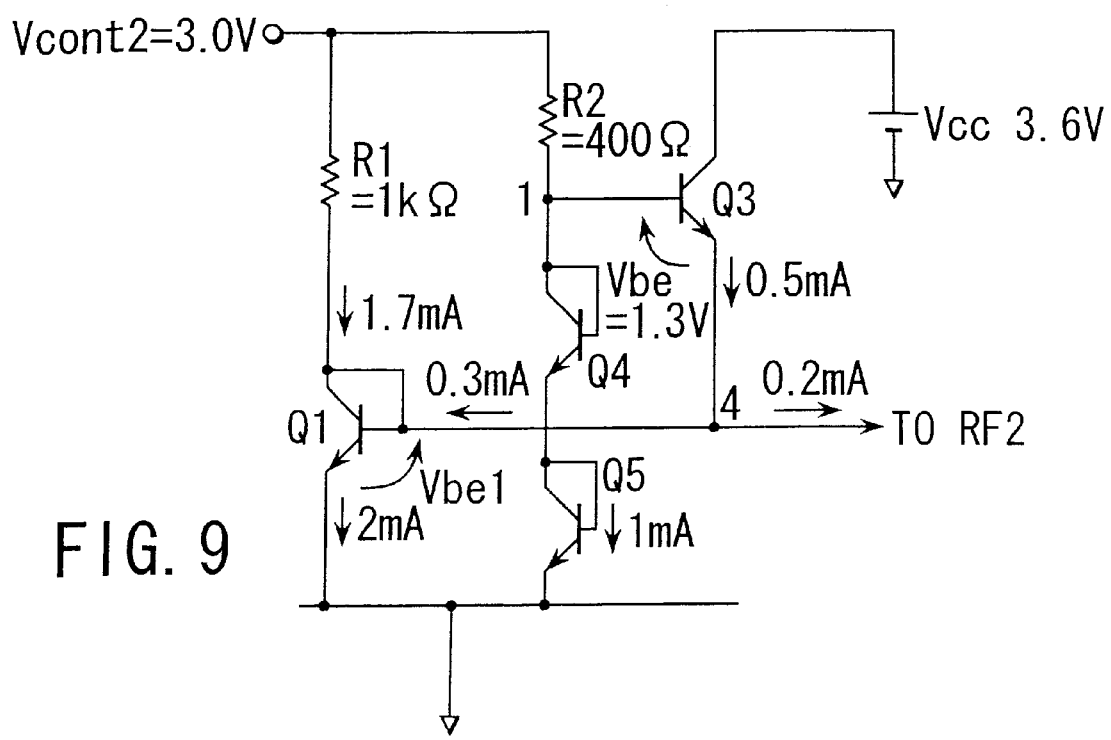
FIG. 9 is a circuit diagram showing the operating state of the bias circuit of FIG. 8 used in the back-stage amplifier in the linear amplifier of FIG. 2.
Figure 10:
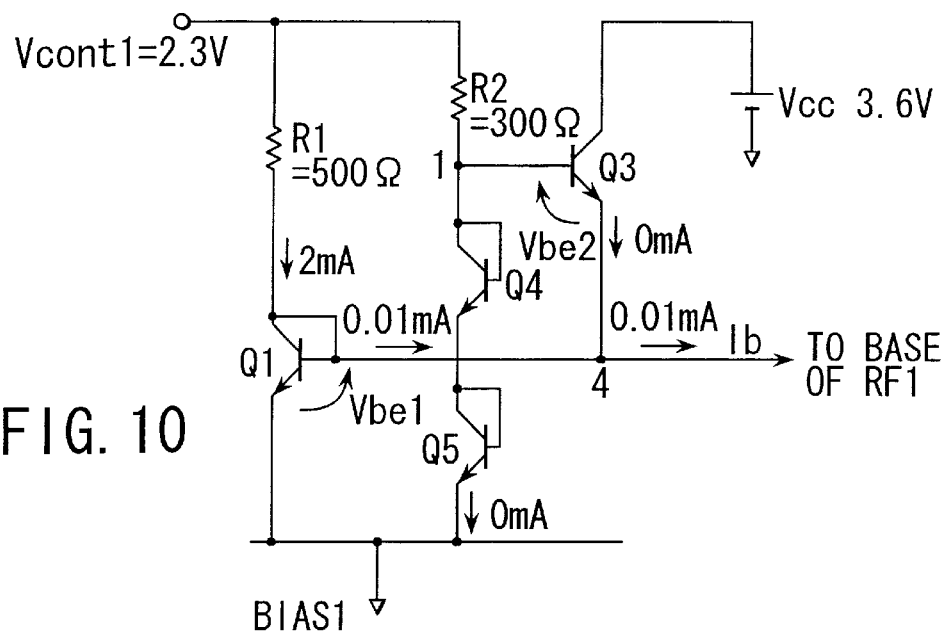
FIG. 10 is a circuit diagram showing the operating state of the bias circuit of FIG. 8 used in the front-stage amplifier in the linear amplifier of FIG. 2.

Next, explanation will be given about the setting and operation of the circuit when the first and second current-mirror circuits of FIG. 8 are used in the amplification bipolar transistors RF1 and RF2. FIGS. 9 and 10 are circuit diagrams showing the operating state of the bias circuit of FIG. 8 used in the back-stage and front-stage amplifiers in the linear amplifier of FIG. 2.

In these figures, too, HBTs using InGaP/GaAs have been used as the transistors. This type of transistor operates with the base-emitter voltage Vbe in the range from about 1.2 to 1.3V. The transistor Q1 has an emitter size of 4×20 um², the transistor Q3 has an emitter size of 4×60 um², and the transistors Q4, Q5 have an emitter size of 4×20 um².

As described in the first embodiment, to realize high efficiency of the back-stage transistor RF2 during high output, the back-stage bias circuit (BIAS2) is designed to have the class AB bias setting. In this case, the resistances R1, R2 and the control voltage Vcont2 are set so that the transistor Q3 of the second current-mirror circuit in the bias circuit of FIG. 8 may be already ON, or the voltage at terminal 1 may be twice as high as the base-emitter voltage Vbe.

For example, in the bias circuit BIAS2 of FIG. 9, if R1=1 KW, R2=400 W, and the control voltage (Vcont2) is set to 3.0V, the voltage at terminal 1 will be about 2.6V, or twice as high as the base-emitter voltage Vbe and the collector currents of the transistors Q4 and Q5 will be about 1 mA and the collector current of the transistor Q1 will also be 2 mA. In addition, the current flowing through the resistance R1 will be 1.7 mA, the current flowing through the resistance R2 will be 1 mA, and the collector current of the transistor Q3 will be 0.5 mA. At this time, when the back-stage transistor RF2 has 30 times the size of the transistor Q1, the bias current of the transistor RF2 is set to about 60 mA.

Similarly with FIG. 5, the AM—AM characteristic, efficiency, and distortion of only the back-stage amplifier are such that, in the region where the efficiency (η) is high, IM3 with two frequency input has deteriorated significantly due to a shift in the AM—AM characteristic. Here, IM3 corresponds to distortion. As in the first embodiment, to correct the AM—AM characteristic of the back-stage amplifier, the bias circuit (BIAS1) for the front-stage amplifier is so designed that, when the RF input is zero or small, the bias voltage is determined only by the first current-mirror circuit and that, when the RF input level has risen, the bias voltage is determined by the second current-mirror circuit. This enables a change in the AM—AM characteristic of the front-stage amplifier to cancel a change in the AM—AM characteristic of the back-stage amplifier, improving the AM—AM characteristic of the entire two-stage amplifier.

For example, if R1=500 W, R2=300 W, and the control voltage is set to 2.3V in the front-stage bias circuit as shown in FIG. 10, when the current flowing through the base of the transistor RF1 is 0.01 mA, no current flows through the transistors Q4 and Q5, the voltage at terminal 1 is 2.3V, the collector current of the transistors Q1 is 2 mA, and the collector current of the transistor Q3 is about 0 mA. At this time, when the front-stage transistor RF1 has 12 times the size of the transistor Q1, the bias current of the transistor RF1 is biased to about 20 mA.

On the other hand, when the current flowing through the base of the transistor RF1 becomes 1.2 mA, if R1=500 W, R2=300 W and the control voltage is set to 2.3V as described above, then the voltage at terminal 1 will be 2.3V, the voltage at terminal 4 is 1.1V, the collector current of the transistors Q1 will be 2.4 mA, and the collector current of the transistor Q3 will be about 0.8 mA. The base current of the transistor Q1 will become 0.4 mA and a current of 0.4+0.8=1.2 mA will flow to the base of the transistor RF1. At this time, the bias current of the front-stage transistor RF1 is biased to about 50 mA.

As shown in FIG. 10, the current flowing through the transistors Q4 and Q5 in the front-stage amplifier in the linear amplifier of the second embodiment is always zero, regardless what value the base current of the transistor RF1 takes. The reason for this is that the control voltage (Vcont1) is lower than twice the operating voltage of the transistors Q4, Q5.

As in the first embodiment, in the bias circuit of the second embodiment, when the base current IB of the transistor RF1 is zero or small, the transistor Q1 is ON, but the transistor Q3 is OFF. As the base current IB starts to increase, the current flowing through the resistance R1 increases by an increase in the base current IB. This lowers the base-emitter voltage Vbe1 of the transistor Q1, lowering the gain produced by the first current-mirror circuit. Then, the transistor Q1 turns off.

On the other hand, the emitter voltage of the transistor Q3 drops with the base voltage Vbe1 of the transistor Q1, allowing the base-emitter voltage Vbe2 of the transistor Q3 to turn on, which causes the second current-mirror circuit to operate. Thus, the transistor Q3 starts to supply the base current IB of the transistor RF1, which keeps the base voltage of the transistor RF1 constant, with the result that a rise in Gm caused by an increase in the collector current makes the gain increase. As in FIG. 7, since the gain compression in the back-stage amplifier is compensated for by an increase in the gain in the front-stage amplifier, the amplifier can be operated linearly with almost no shift in the AM—AM characteristic, when being operated as a two-stage amplifier. Thus, IM3 can be improved even at high efficiency.

(Third Embodiment)

Figure 11:
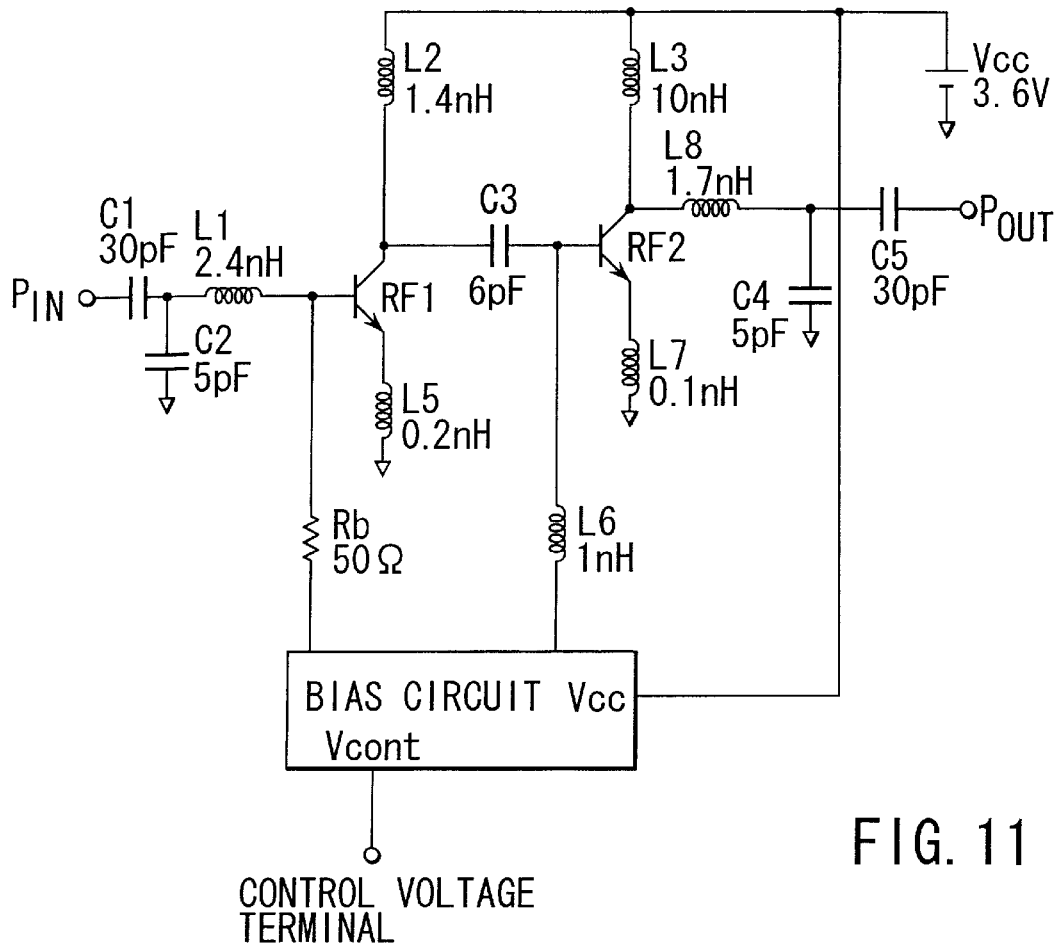
FIG. 11 is a circuit diagram of a linear amplifier according to a third embodiment of the present invention.

FIG. 11 is a circuit diagram of a linear amplifier according to a third embodiment of the present invention. In the third embodiment, the control voltage to the bias circuit for a plurality of amplification transistors including the last stage can be varied simultaneously. Controlling the control voltage enables the gain variable in a wide control voltage range to be compatible with compensation for the temperature change. The linear amplifier of the third embodiment particularly enables a small-drawn-current operation when it is used with a small gain and a low output.

As shown in FIG. 11, the linear amplifier of the third embodiment is composed of two stages of amplifiers. An amplification bipolar transistor RF1 is the front-stage transistor and an amplification bipolar transistor RF2 is the back-stage transistor. A bias circuit is connected to the base of each of the transistor RF1 and the transistor RF2. Capacitors C1 to C5 have capacitances 30 pF, 5 pF, 6 pF, 5 pF, and 30 pF, respectively as shown in the figure. In addition, inductors L1 to L3 and L5 to L8 have inductances 2.4 nH, 1.4 nH, 10 nH, 0.2 nH, 1 nH, 0.1 nH, 0.1 nH, and 1.7 nH, respectively. Pin indicates an input terminal and Pout indicates an output terminal.

A power-supply voltage of Vcc=3.6V is applied via inductance L2 to the collector of the transistor RF1 and via inductance L3 to the collector of the transistor RF2. The bias circuit is connected to a control voltage terminal, which allows a control voltage Vcont to be applied to the bias circuit. In addition, the power supply voltage of Vcc=3.6V is applied to the bias circuit.

Next, the bias circuit of the third embodiment will be explained. FIG. 12 is a circuit diagram of the bias circuit in the linear amplifier of the third embodiment.

As shown in FIG. 12, the bias circuit of the third embodiment is composed of two unit of the bias circuit of the first embodiment. Specifically, the collector of a transistor Q1 is connected to one end of a resistance R1. The control voltage Vcont is applied to the other end of the resistance R1. In addition, the collector of a transistor Q2 is connected to one end of a resistance R2 via a terminal 1. The control voltage Vcont is applied to the other end of the resistance R2.

The base and collector of the transistor Q1 are short-circuited. The transistor Q1 functions as a diode. The base of the transistor Q1 and that of a transistor Q2 are connected to each other and further connected to the emitter of a transistor Q3. The base of the transistor Q3 is connected to the terminal 1. The power-supply voltage Vcc is applied to the collector of the transistor Q3. Both of the emitters of the transistors Q1 and Q2 are grounded. The emitter side (terminal 4) of the transistor Q3 is also grounded.

In the bias circuit constructed as described above, the first current-mirror circuit is composed of the resistance R1 and transistor Q1, whereas the second current-mirror circuit is composed of the resistance R2 and transistors Q2 and Q3.

Similarly, in parallel with the above configuration, the collector of a transistor Q6 is connected to one end of a resistance R4. The control voltage Vcont is applied to the other end of the resistance R4. In addition, the collector of a transistor Q7 is connected to one end of a resistance R5 via a terminal 5. The control voltage Vcont is applied to the other end of the resistance R5. The base and collector of the transistor Q6 are short-circuited. The transistor Q6 functions as a diode. The base of the transistor Q6 and that of a transistor Q7 are connected to each other and further connected to the emitter of a transistor Q8. The base of the transistor Q8 is connected to the terminal 5. The power-supply voltage Vcc is applied to the collector of the transistor Q8. Both of the emitters of the transistors Q6 and Q7 are grounded. The emitter side (terminal 6) of the transistor Q8 is also grounded.

In the bias circuit constructed described above, the first current-mirror circuit is composed of the resistance R4 and transistor Q6, whereas the second current-mirror circuit is composed of the resistance R5 and the transistors Q7 and Q8.

In the above circuit configuration, the terminal 4 is connected to the base of the transistor RF1 and the terminal 6 is connected to the base of the transistor RF2. While in the third embodiment, the resistances R1, R2, R4, and R5 are connected in common and further connected to the control voltage (Vcont) terminal, the resistance R1 may be connected via the resistance R2 to and the resistance R4 be connected via the resistance R5 to the control voltage (Vcont) terminal. In FIG. 12, the resistances R1, R2, R4, and R5 have the resistance values shown in the figure respectively and the power-supply voltage is set to 3.6V.

HBTs which use InGaP as their emitters and GaAs as their bases are used as the transistors. This type of transistor operates with the base-emitter voltage Vbe being at about 1.3V. Each of the transistors Q1 and Q2 has an emitter size of 4×10 um$^2$, each of the transistors Q3 and Q8 has an emitter size of 4×30 um$^2$, and each of the transistors Q6 and Q7 has an emitter size of 4×20 um$^2$. The amplification transistor RF1 has an emitter size of 4×30 um$^2$ and is of a multi-emitter structure with 6 emitters. The amplification transistor RF2 has an emitter size of 4×30 um$^2$ and is of a multi-emitter structure with 32 emitters.

In FIG. 12, the control voltage Vcont is applied via the resistances R1 and R4 serving as the current source in the first current-mirror circuit of the amplifier. The control voltage Vcont is also applied via the resistances R2 and R5 serving as the current source in the second current-mirror circuit. The terminals for the control voltage Vcont are connected to each other. When the base potential of the transistor Q8 is equal to or lower than twice the on voltage of the base-emitter voltage Vbe, the first current-mirror circuit supplies the bias voltage. When the base potential of the transistor Q8 is higher than twice the on voltage of the base-emitter voltage Vbe, the first and second current-mirror circuits supply the bias voltage. This enables the gain variable in a wide control voltage range to be compatible with compensation for the temperature change. Moreover, by varying the control voltages of the bias circuit to the amplification transistors RF1 and RF2 simultaneously, a small-drawn-current operation is possible in small-gain, low-output use.

Furthermore, the circuit configuration described in the second embodiment may be applied to the bias circuit of FIG. 11. Namely, the bias circuit of FIG. 11 may be composed of a series connection of base-collector-shorted transistors. FIG. 13 is a circuit diagram showing a modification of the bias circuit in the linear amplifier according to the third embodiment.

As shown in FIG. 13, in the second current-mirror circuit, the emitter of the transistor Q2 is connected to the collector of the transistor Q2'. The collector of the transistor Q2 is connected to the resistance R2. The emitter of the transistor Q2' is grounded. The base and collector of the transistor Q2 are short-circuited. The base and collector of the transistor Q21 are short-circuited. These transistors Q2, Q21 function as diodes.

Similarly, in parallel with this configuration, the second current-mirror circuit has the following configuration: the emitter of the transistor Q5 is connected to the collector of the transistor Q5'. The collector of the transistor Q5 is connected to the resistance R5. The emitter of the transistor Q5' is grounded. The base and collector of the transistor Q5 are short-circuited. The base and collector of the transistor Q5' are short-circuited. These transistors Q5, Q5' function as diodes.

In the above circuit configuration, the base of the transistor Q1 is connected via terminal 4 to the base of the transistor RF1 and the base of the transistor Q4 is connected via terminal 6 to the base of the transistor RF2. While in the third embodiment, the resistances R1, R2, R4, and R5 are connected in common and further connected to the control voltage (Vcont) terminal, the resistance R1 may be connected via the resistance R2 to and the resistance R4 be connected via the resistance R5 to the control voltage (Vcont) terminal. In FIG. 13, the resistances R1, R2, R4, and R5 have the resistance values shown in the figure respectively and the power-supply voltage Vcc is set to 3.6V.

Furthermore, HBTs using InGaP/GaAS are used as the transistors as in FIG. 12. This type of transistor operates with the base-emitter voltage Vbe being at about 1.3V. Each of the transistors Q1 and Q2 has an emitter size of 4×10 um$^2$, each of the transistors Q3 and Q8 has an emitter size of 4×30 um$^2$, each of the transistors Q6 and Q7 has an emitter size of 4×20 um$^2$, each of the transistors Q2 and Q2' has an emitter size of 4×10 um$^2$, and each of the transistors Q5 and Q5' has an emitter size of 4×20 um$^2$.

In FIG. 13, the control voltage Vcont is applied in the same manner as in FIG. 12. When the base potential of the transistor Q8 is equal to or lower than twice the on voltage of the base-emitter voltage Vbe, the first current-mirror circuit supplies the bias voltage. When the base potential of the transistor Q8 is higher than twice the on voltage of the base-emitter voltage Vbe, the first and second current-mirror circuits supply the bias voltage. This enables the gain variable in a wide control voltage range to be compatible with compensation for the temperature change as in the embodiment of FIG. 12. Moreover, a small-drawn-current operation is possible in small-gain, low-output use.

As shown in FIG. 13, use of a series connection of base-collector-shorted transistors (Q2, Q2', Q5, Q5') enables the current flowing through the resistances R2 and R5 during low output to be reduced to 0 mA.

Figure 14:
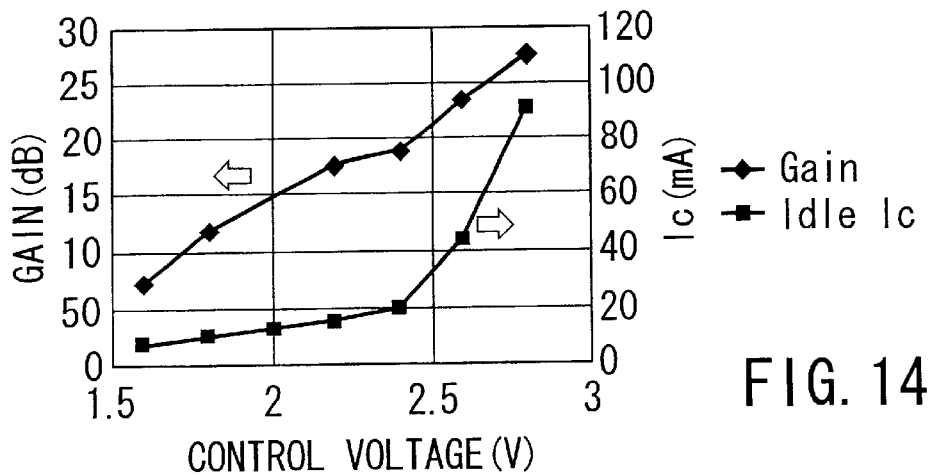
FIG. 14 is a characteristic diagram showing the relationship between the control voltage and the gain and between the control voltage and the bias current in the linear amplifier according to the third embodiment.

FIG. 14 is a characteristic diagram showing the relationship between the control voltage and the gain and between the control voltage and the bias current in the linear amplifier according to the third embodiment. Measurements were made at a frequency of 1.9 GHz. As shown in FIG. 14, the gain was varied linearly in the control voltage range from 1.6V to 2.8V. It is seen that the current is reduced significantly at low-output levels.

Figure 15:
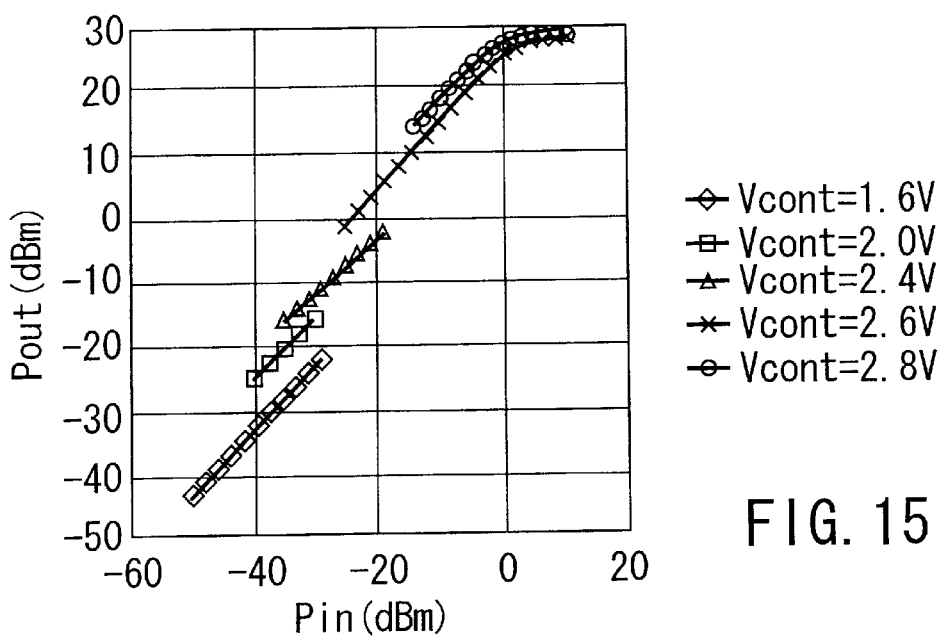
FIG. 15 is a characteristic diagram showing the input/output characteristic of the linear amplifier according to the third embodiment.

FIG. 15 is a characteristic diagram showing the input/output characteristic of the linear amplifier according to the third embodiment. As seen from the figure, when the control voltage Vcont is at 1.6V, 2.0V, 2.4V, 2.6V, and 2.8V, the linearity of the input/output characteristic is maintained satisfactorily and an excellent amplification characteristic can be obtained.

Figure 16:
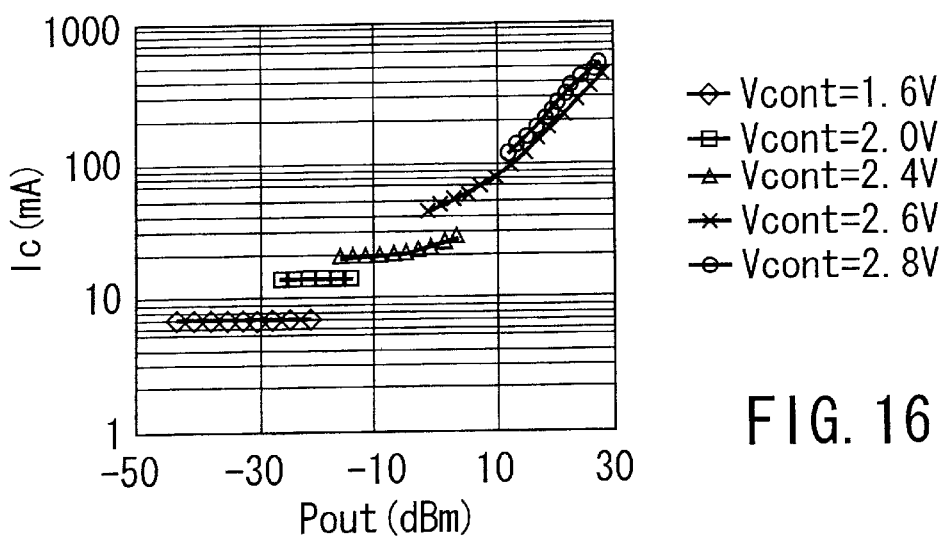
FIG. 16 is a characteristic diagram showing the relationship between the output level and the drawn current in the linear amplifier according to the third embodiment.

FIG. 16 is a characteristic diagram showing the relationship between the output level and the drawn current in the linear amplifier according to the third embodiment. As seen from the figure, when the control voltage Vcont is lowered to 2.8V, 2.6V, 2.4V, 2.0V, and 1.6 in that order, the drawn current becomes smaller. When Vcont is at 1.6V and 2.0V, a decrease in the drawn current is particularly significant. Therefore, the drawn current can be optimized by adjusting the control voltage according to the output level.

Figure 17:
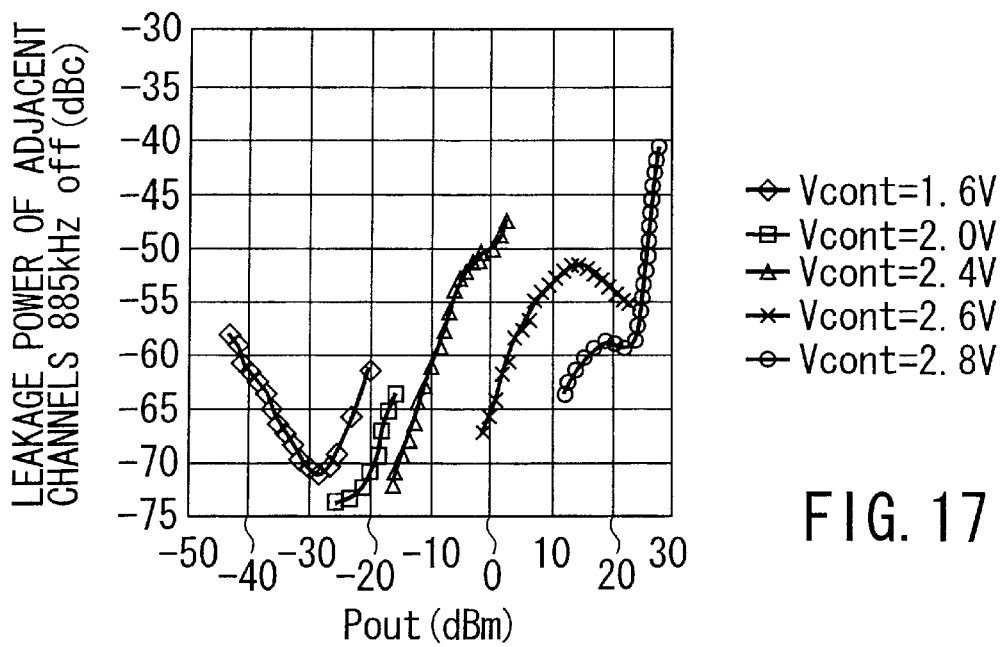
FIG. 17 is a characteristic diagram showing the relationship between the adjacent channel leakage power ratio in 900 MHz detuning in the case of an IS-95 CDMA signal.

Furthermore, the linear amplifier according to the third embodiment can be used as the amplifier at the last stage of CDMA. FIG. 17 is a characteristic diagram of distortion in that case and shows the relationship between the adjacent channel leakage power ratio and the output level at 900 MHz in the case of an IS-95 CDMA signal.

The adjacent channel leakage power ratio is obtained by integrating the adjacent channel leakage power at 30 kHz with a 1.23-MHz carrier. As shown in FIG. 17, when the output level is 0 dBm or below, even if the current is reduced to 20 mA (see FIG. 16), the distortion level is as low as −50 dBC or below. At −20 dBm or below, even if the current is reduced extremely to 6 mA (see FIG. 16), the distortion level is low. Therefore, it is possible to optimize the distortion and drawn current according to the output level.

Figure 18:
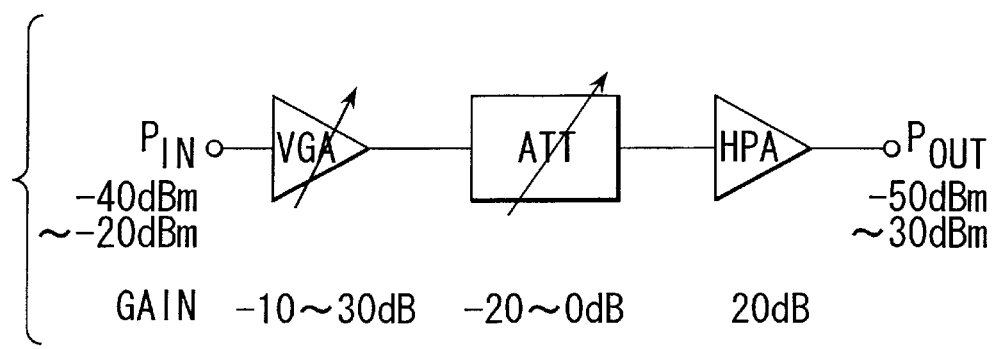
FIG. 18 schematically shows an example of a conventional CDMA output level varying system.
Figure 19:
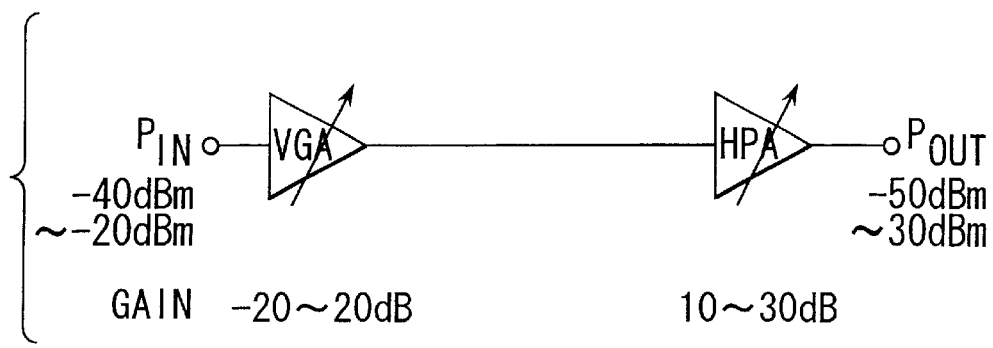
FIG. 19 schematically shows an example of a CDMA output level varying system in using a variable-gain linear amplifier according to the third embodiment.
Figure 20:
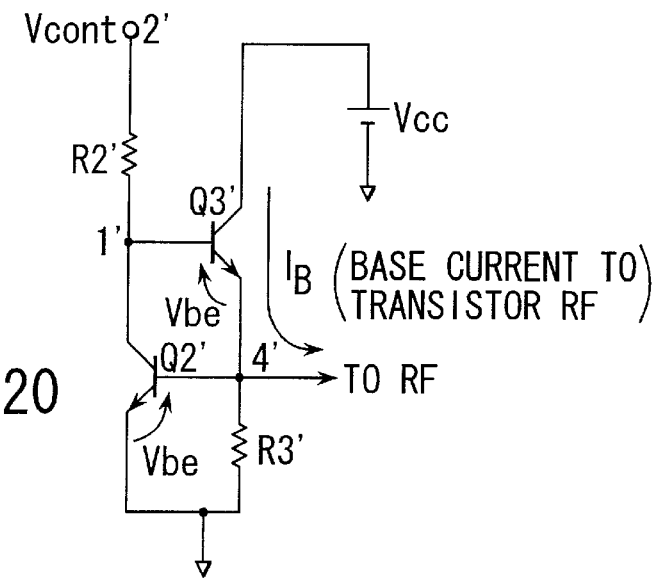
FIG. 20 shows a conventional bias circuit for supplying the base current with a low-output-impedance emitter follower.
Figure 21:
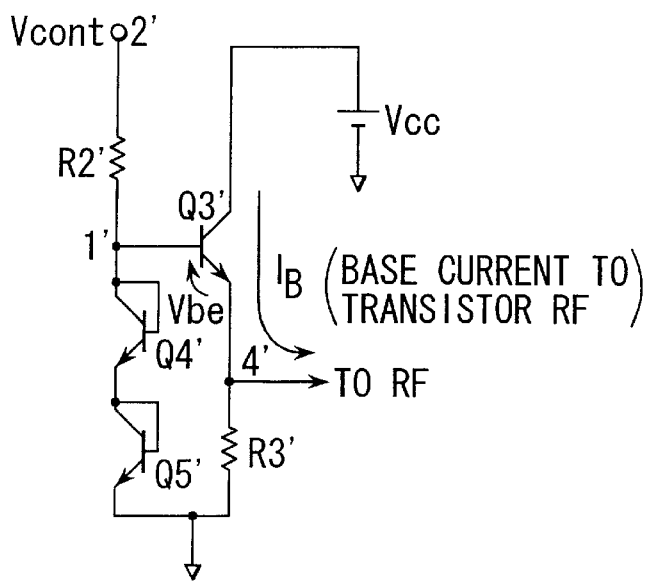
FIG. 21 shows another conventional bias circuit for supplying the base current with a low-output-impedance emitter follower.
Figure 22:
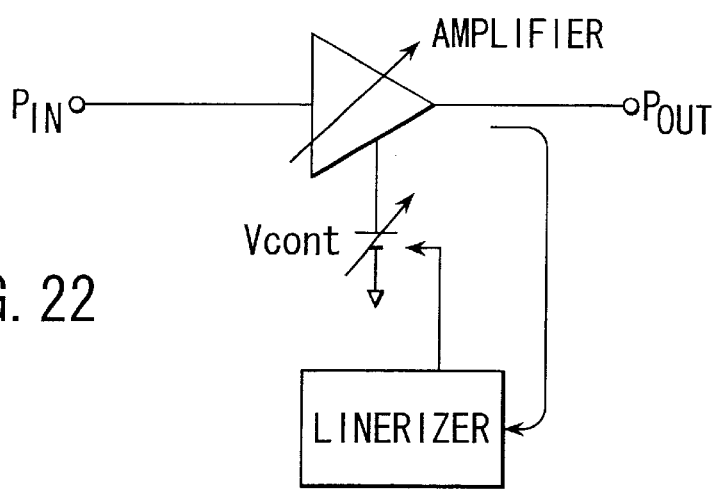
FIG. 22 schematically shows a system which realizes a linear operation of an amplifier using a conventional linearizer.

FIG. 18 schematically shows an example of a conventional CDMA output level varying system. FIG. 19 schematically shows an example of a CDMA output level varying system in using a variable-gain linear amplifier according to the third embodiment.

As shown in FIG. 18, all the variable gain functions have been realized by the gain variable amplifier or the gain variable attenuator at the front stage of a conventional amplifier. Use of a linear amplifier of the present invention enables part of the variable gain functions realized by the gain variable amplifier or attenuator at the front stage of the amplifier to be left to the amplifier at the last stage, which helps reduce the load on the system at the front stage of the amplifier. Moreover, using a linear amplifier of the present invention as, for example, a 10-to-30-dB gain variable amplifier makes it possible to eliminate the variable attenuator and others at the front stage as shown in FIG. 19.

The present invention is not limited to the above embodiments. For instance, while the base-connector-shorted transistors have been used as diodes, diodes may be used instead of the transistors. For example, in the first current-mirror circuit, a diode element whose anode is connected to the power-supply terminal via the first resistance and whose cathode is grounded may be used in place of the first transistor whose collector is connected via the first resistance to the power-supply terminal and whose emitter is grounded.

Figure 23:
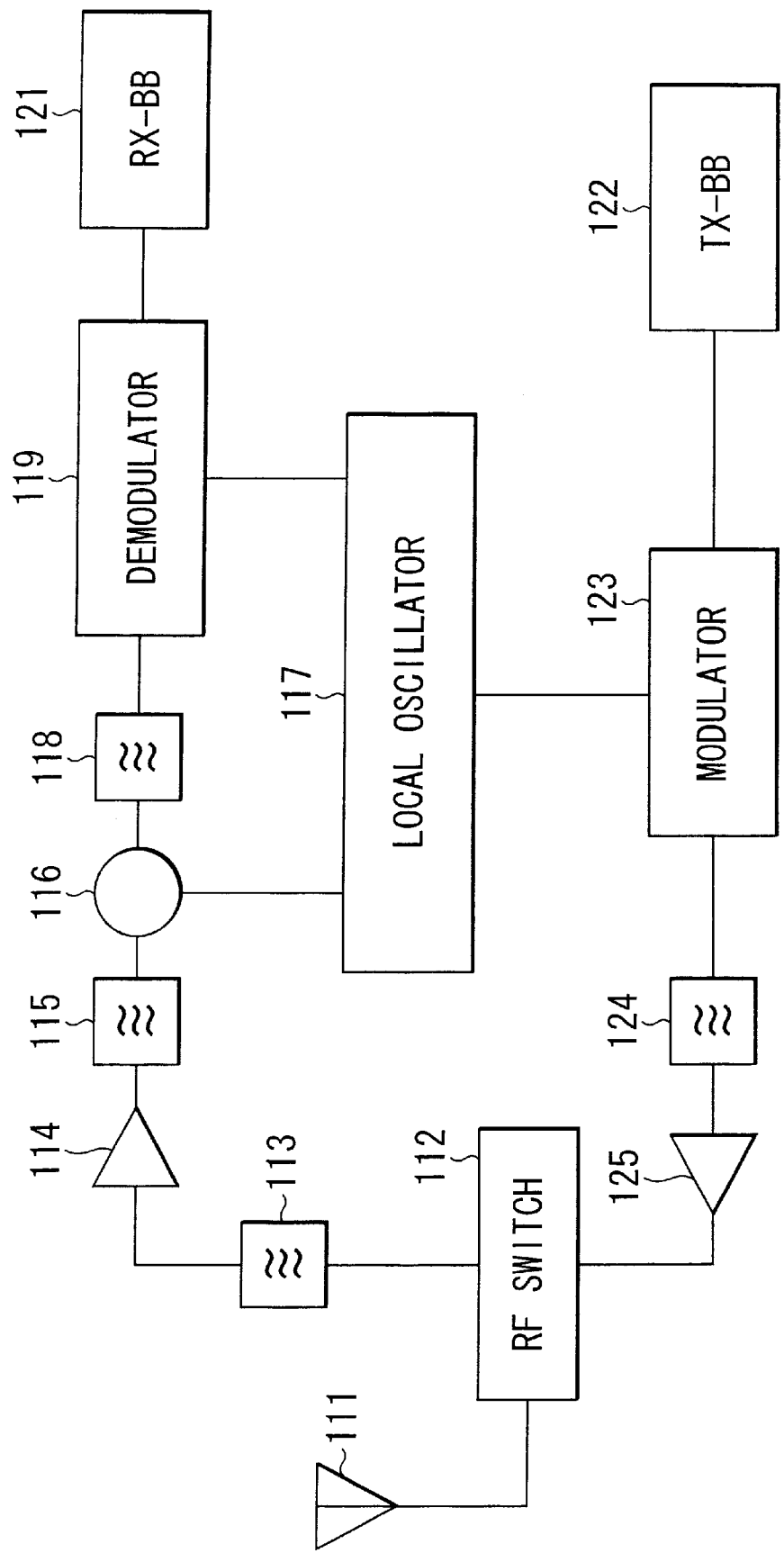
FIG. 23 is a block circuit diagram of a radio communication apparatus using a linear amplifier according to the present invention.

FIG. 23 shows a portable telephone to which a linear amplifier of the present invention has been applied. In the radio communication apparatus, an antenna 111 is coupled with a transmission/reception selector switch (RF switch) 112 for switching between the reception system and the transmission system.

In the reception system, the transmission/reception selector switch (duplexer) 112 is connected to the input terminal of a down converter 116 via a band-pass filter 113, a low-noise amplifier 114, and a band-pass filter 115. The other input terminal of the down converter 116 receives a first local oscillation signal from a local oscillation signal generator circuit (or local oscillator) 117. The output terminal of the down converter 116 is connected via a band-pass filter 118 to an orthogonal demodulator 119. A second local oscillation signal is inputted to the orthogonal demodulator 119. The outputs Ich(RX) and Qch(RX) of the orthogonal demodulator 119 are inputted to a baseband processor 121, which demodulates the outputs into a reception signal.

In the transmission system, a baseband signal processing section 122 for generating a baseband signal is connected to an orthogonal demodulator 123. Using the baseband signal, the orthogonal demodulator 123 modulates the local oscillation signal from the local oscillator 117. The modulated signal is inputted to a power amplifier 125 via a band-pass filter 124. The amplified modulated signal from the amplifier 125 passes through the transmission/reception selector switch 112 and is radiated from the antenna 111. The aforementioned linear amplifier of the present invention is used in the power amplifier 125 of the transmission system.

With the linear amplifier of the invention, a smaller drawn current in low output can be realized by making only the intermodulation distortion smaller even when the last stage is operating at high efficiency and securing the linear operation at high efficiency.

Furthermore, in low output level use, the drawn current can be made smaller without sacrificing distortion by lowering the control voltage to reduce the idle current.

In addition, with the radio communication apparatus of the present invention, it is possible to reduce the power consumption in a wide dynamic output range and simplify the system.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A bias circuit for a linear amplifier comprising:
    a first current-mirror circuit including a first resistance, a first transistor whose base and collector are short-circuited for diode connection and whose emitter is grounded, and a power-supply terminal connected via said first resistance to the collector;
    a second current-mirror circuit including a second transistor whose collector and base are connected to power-supply terminals; and
    at least one first amplification transistor whose emitter is grounded, wherein
        the base of said first transistor and the emitter of said second transistor are connected to a base of the amplification transistor and the linear amplifier.

2. The bias circuit according to claim 1, further comprising a plurality of stages of second amplification transistors including at least one second amplification transistor, wherein
    the base of said first transistor and the emitter of said second transistor are connected to a base of a transistor at an earlier stage than a last stage in the plurality of stages of second amplification transistors.

3. The bias circuit according to claim 1, wherein the collector of said first transistor and the base of said second transistor are connected to a common power supply.

4. The bias circuit according to claim 1, wherein the base of said second transistor is connected via a second resistance to a power-supply terminal.

5. The bias circuit according to claim 1, wherein the collector of said first transistor is connected via said first resistance to the base of said second transistor and the base of said second transistor is connected to the power-supply terminal of said first transistor.

6. The bias circuit according to claim 1, wherein said first current-mirror circuit has a higher impedance than said second current-mirror circuit when viewed from said amplification transistor side.

7. The bias circuit according to claim 1, wherein said first current-mirror circuit applies a bias to the base of said amplification transistor when the output level of said amplification transistor is low, and said second current-mirror circuit applies a bias to the base of said amplification transistor when the output level of said amplification transistor is high.

8. The bias circuit according to claim 2, wherein said first and second current-mirror circuits are set so that distortion of modulation in the amplification characteristic of said second amplification transistor at an earlier stage than the second amplification transistor at the last stage cancels distortion of modulation in the amplification characteristic of said second amplification transistor at the last stage.

9. A bias circuit for a linear amplifier comprising:
   a first current-mirror circuit including a first resistance, a first transistor whose base and collector are short-circuited for diode connection and whose emitter is grounded, and a variable-power-supply terminal connected via said first resistance to said collector;
   a second current-mirror circuit including a second transistor whose collector is connected to a power supply terminal and whose base is connected to a variable-power-supply terminal; and
   an amplification transistor whose emitter is grounded, wherein
      the base of said first transistor and the emitter of said second transistor are connected to the base of said amplification transistor and the linear amplifier.

10. A radio communication apparatus comprising a reception unit for receiving a radio signal and a transmission unit using a linear amplifier according to claim 9 as a power amplifier for amplifier for amplifying a transmission signal.

11. A radio communication apparatus according to claim 10, wherein a power-supply voltage at said variable-power-supply terminal is set low when an output level is low, and a gain of said at least one first amplification transistor decreases.

12. A linear amplifier comprising:
   a plurality of stages of amplification transistors whose emitters are grounded;
   a first current-mirror circuit including a first transistor whose base and collector are short-circuited for diode connection and whose emitter is grounded, a first resistance, and a variable-power-supply terminal connected via said first resistance to said collector; and
   a second current-mirror circuit including a second transistor whose collector is connected to a power-supply terminal and whose base is connected to a variable-power-supply terminal, wherein
   said first current-mirror circuit and said second current-mirror circuit are provided for each of said plurality of stages of amplification transistors, and the base of said first transistor and the emitter of said second transistor are connected to the base of the corresponding one of said amplification transistors.

13. The linear amplifier according to claim 12, wherein the collector of said first transistor and the base of said second transistor are connected to a common power supply.

14. The linear amplifier according to claim 12, wherein all the variable-power-supply terminals in said first current-mirror circuit and said second current-mirror circuit provided for each stage of said plurality of stages of amplification transistors are a common variable-power-supply terminal.

15. The linear amplifier according to claim 12, wherein the base of said second transistor is connected via a second resistance to a variable-power-supply terminal.

16. The linear amplifier according to claim 12, wherein the collector of said first transistor is connected via said first variable power supply terminal and the base of said second transistor is connected to the variable-power-supply terminal of said first transistor.

17. The linear amplifier according to claim 12, wherein said first current-mirror circuit has a higher impedance than said second current-mirror circuit when viewed from said amplification transistor side.

18. The linear amplifier according to claim 12, wherein the base of said second transistor is grounded via a plurality of diode-connected transistors connected in series.

19. The linear amplifier according to claim 18, wherein each of said plurality of diode-connected transistors is composed of a transistor whose base and collector are short-circuited for diode connection.

20. The linear amplifier according to claim 12, wherein said second current-mirror circuit includes a third transistor whose emitter is grounded, whose base is connected to the base of said first transistor, and whose collector is connected to the base of said second transistor.

21. The linear amplifier according to claim 12, wherein the power-supply terminal to which the collector of said second current-mirror circuit is connected is a fixed-potential power-supply terminal.

22. The linear amplifier according to claim 12, wherein the gain of said amplification transistors is varied by controlling the power-supply voltage at said variable-power-supply terminal.

23. A linear amplifier comprising:
   a multistage amplifier composed of emitter-grounded transistors;
   a bias circuit for supplying a direct-current bias base voltage to the transistor at each stage of said multistage amplifier;
   a first current-mirror circuit which includes a first transistor whose base and collector are short-circuited for diode connection, determines said base voltage with the first transistor, and has a high output impedance; and
   a second current-mirror circuit which includes a second transistor whose base and collector are connected with each other via an emitter follower transistor, determines said base voltage with the second transistor, and has a low output impedance, and which is connected in parallel with said first current-mirror circuit.

24. A bias circuit for a linear amplifier comprising:
   a first current-mirror circuit including a first resistance and a diode-connected transistor whose anode is connected via the first resistance to a power-supply terminal and whose cathode is grounded;
   a second current-mirror circuit including a transistor element whose collector and base are connected to power-supply terminals; and an amplification transistor whose emitter is grounded, wherein the anode of said diode-connected transistor and the emitter of said transistor element are connected to the base of said amplification transistor and the linear amplifier.

25. A linear amplifier comprising:

multiple stages of amplification transistors whose emitters are grounded;

a first current-mirror circuit including a first resistance and a diode-connected transistor whose anode is connected via the first resistance to a power-supply terminal and whose cathode is grounded; and a second current-mirror circuit including a transistor element whose collector and base are connected to power-supply terminals, wherein the anode of said diode-connected transistor and the emitter of said transistor element are connected to the base of an amplification transistor at an earlier stage than the last stage of said amplification transistors.

26. A bias circuit for a linear amplifier comprising:

a first current-mirror circuit including a first resistance and a diode element whose anode is connected via the first resistance to a variable-power-supply terminal and whose cathode is grounded;

a second current-mirror circuit including a transistor element whose collector is connected to a power-supply terminal and whose base is connected to a variable-power-supply terminal; and an amplification transistor whose emitter is grounded, wherein the anode of said diode-connected transistor and the emitter of said transistor element are connected to the base of said amplification transistor and the linear amplifier.

27. A linear amplifier comprising:

multiple stages of amplification transistors whose emitters are grounded;

a first current-mirror circuit including a first resistance and a diode-connected transistor whose anode is connected via the first resistance to a variable-power-supply terminal and whose cathode is grounded; and a second current-mirror circuit including a transistor element whose collector is connected to a power-supply terminal and whose base is connected to a variable-power-supply terminal, wherein said first current-mirror circuit and said second current-mirror circuit are provided for each stage of said multiple stages of amplification transistors, and the anode of said diode-connected transistor and the emitter of said transistor element are connected to the base of the corresponding one of said amplification transistors.

28. A linear amplifier comprising:

a multistage amplifier composed of emitter-grounded transistors;

a bias circuit for supplying a direct-current bias base voltage to said transistor at each stage of said multistage amplifier;

a first current-mirror circuit which includes a diode element, determines said base voltage with the diode element, and has a high output impedance; and a second current-mirror circuit which includes a second transistor whose base and collector are connected with each other via an emitter follower transistor, determines said base voltage with the second transistor, and has a low output impedance, and which is connected in parallel with said first current-mirror circuit.

29. A bias circuit for a linear amplifier comprising:

a first current-mirror circuit including a first resistance, a first transistor whose base and collector are short-circuited for diode connection and whose emitter is grounded, and a power-supply terminal connected via said first resistance to the collector;

a second current-mirror circuit including a second transistor whose collector and base are connected to power-supply terminals; and a plurality of diode-connected transistors connected in series through which the base of said second transistor is grounded, wherein the base of the first transistor and the emitter of the second transistor are connected to the linear amplifier.

30. The bias circuit according to claim 29, wherein each of said plurality of diode-connected transistors is composed of a transistor whose base and collector are short-circuited for diode connection.

31. A bias circuit for a linear amplifier comprising:

a first current-mirror circuit including a first resistance, a first transistor whose base and collector are short-circuited for diode connection and whose emitter is grounded, and a power-supply terminal connected via said first resistance to the collector; and a second current-mirror circuit including a second transistor whose collector and base are connected to power-supply terminals, and a third transistor whose emitter is grounded, wherein a base of the third transistor is connected to the base of said first transistor, the emitter of said second transistor and the linear amplifier, and a collector of the third transistor is connected to the base of said second transistor.

* * * * *